United States Patent
Kaushal et al.

(10) Patent No.: US 7,348,203 B2
(45) Date of Patent: Mar. 25, 2008

(54) HERMETIC PACKAGING

(75) Inventors: Tej Paul Kaushal, Malvern (GB); Paul Antony Manning, Malvern (GB); John Peter Gillham, Malvern (GB); Gary Stacey, Harston (GB); David Martin Pooley, Harston (GB); Peter Georg Laitenberger, Harston (GB)

(73) Assignee: QinetiQ Limited, London (GB)

( * ) Notice: Subject to any disclaimer, the term of this patent is extended or adjusted under 35 U.S.C. 154(b) by 251 days.

(21) Appl. No.: 10/523,528

(22) PCT Filed: Sep. 1, 2003

(86) PCT No.: PCT/GB03/03737

§ 371 (c)(1),
(2), (4) Date: Feb. 4, 2005

(87) PCT Pub. No.: WO2004/020961

PCT Pub. Date: Mar. 11, 2004

(65) Prior Publication Data

US 2006/0166407 A1   Jul. 27, 2006

(30) Foreign Application Priority Data

Sep. 2, 2002   (GB) ................................ 0220274.5

(51) Int. Cl.
*H01L 21/00* (2006.01)
*H01L 31/0203* (2006.01)
*H01J 5/02* (2006.01)
*G02B 6/36* (2006.01)

(52) U.S. Cl. ............................ 438/64; 438/48; 438/26; 438/22; 257/433; 257/434; 250/239; 385/93

(58) Field of Classification Search ................ 438/64, 438/48, 26, 22; 257/433, 434; 250/239; 385/93

See application file for complete search history.

(56) References Cited

U.S. PATENT DOCUMENTS

| 3,880,528 | A | * | 4/1975 | Petersen et al. ............. 356/225 |
| 4,307,934 | A | * | 12/1981 | Palmer ........................ 385/93 |
| 4,477,828 | A |  | 10/1984 | Scherer |
| 4,803,360 | A |  | 2/1989 | Ball et al. |
| 5,073,047 | A | * | 12/1991 | Suzuki et al. ................. 385/93 |
| 5,119,462 | A | * | 6/1992 | Matsubara et al. ........... 385/93 |

(Continued)

FOREIGN PATENT DOCUMENTS

EP   1 267 399   12/2002

(Continued)

*Primary Examiner*—Luan Thai
(74) *Attorney, Agent, or Firm*—Nixon & Vanderhye P.C.

(57) ABSTRACT

A method of hermetically packaging an electronic device (8), in an enclosure (2) comprising mutually inter-engageable first and second housing members (4, 6), comprising the steps of securing the electronic device (8) to the first housing member (4), engaging the first (4) and second (6) housing members such that an hermetic seal is provided there between, wherein the engagement step is performed in a controlled atmosphere. The hermetic seal may be provided by an interference fit between the first (4) and second (6) housing members or via sealing means (16) interposed between the housing members (4, 6). The second housing member (6) may comprise an optical element (20), for example a window or lens. The packaging method is particularly applicable to packaging thermal detectors, for example microbolometer arrays.

39 Claims, 3 Drawing Sheets

U.S. PATENT DOCUMENTS

Figure 2:
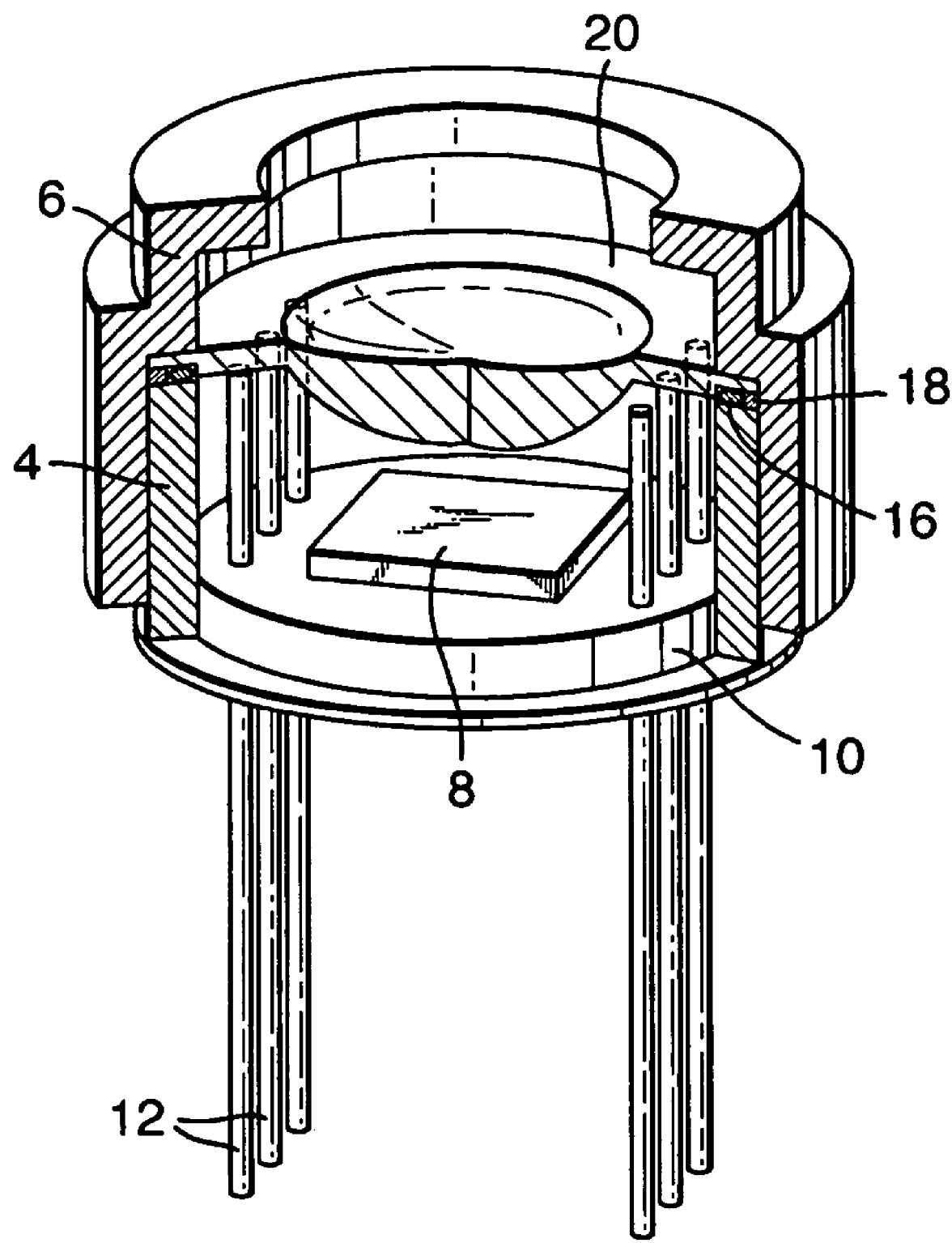

| | | | |
|---|---|---|---|
| 5,198,664 A * | 3/1993 | Fayfield | 250/239 |
| 5,333,224 A * | 7/1994 | Kikuchi | 385/93 |
| 5,578,863 A * | 11/1996 | De Poorter | 257/433 |
| 5,693,942 A | 12/1997 | Endo et al. | |
| 5,804,827 A * | 9/1998 | Akagawa et al. | 250/370.06 |
| 5,914,488 A | 6/1999 | Sone | |
| 6,092,935 A * | 7/2000 | Althaus et al. | 385/93 |
| 6,252,229 B1 | 6/2001 | Hays et al. | |
| 6,686,588 B1 * | 2/2004 | Webster et al. | 250/239 |
| 6,758,611 B1 * | 7/2004 | Levin et al. | 385/93 |
| 2002/0000649 A1 | 1/2002 | Tilmans et al. | |

FOREIGN PATENT DOCUMENTS

| WO | WO 91/07788 | 5/1991 |
|---|---|---|
| WO | WO 01/16637 | 3/2001 |

\* cited by examiner

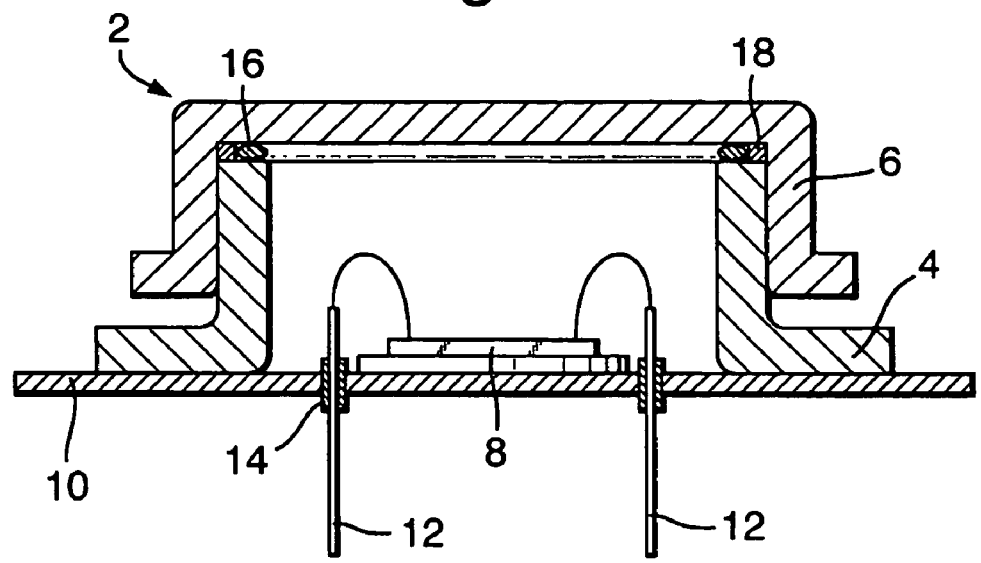
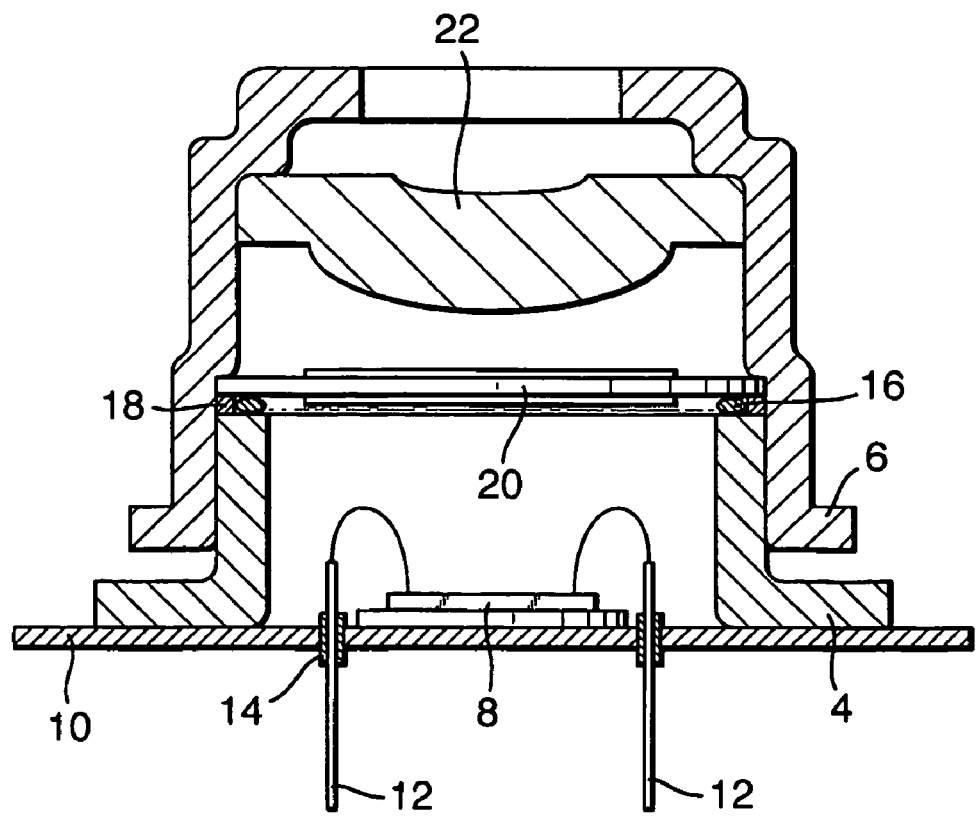

HERMETIC PACKAGING

This application is the US national phase of international application PCT/GB2003/003737, filed in English on 1 Sep. 2003, which designated the US. PCT/GB2003/003737 claims priority to GB Application No. 0220274.5 filed 2 Sep. 2002. The entire contents of these applications are incorporated herein by reference.

The present invention relates to hermetic packaging and in particular to an hermetically sealed enclosure and a method for forming said enclosure. The invention has particular relevance to hermetically sealed enclosures for electronic devices.

Many electronic devices must be packaged in an hermetic (airtight) enclosure in order to maintain correct operation. Furthermore, in many cases, there is a requirement for the package to be evacuated to a low pressure. Examples of such vacuum packaged devices include movable micromirror arrays, micromachined inertial sensors (accelerometers and gyroscopes), microbolometer arrays, gas sensors and absolute pressure sensors.

Hermetic packaging requires that a sealing step be performed under a controlled atmosphere, usually of an inert gas such as nitrogen or argon. As mentioned above, there may be an additional requirement for the package to be evacuated to a low pressure.

Outgassing during the sealing processes can introduce contaminants into the controlled atmosphere within the enclosure, which can be of particular concern for high purity hermetic enclosures. In many cases the sealing process itself can be a significant source of outgassing, which degrades the vacuum level achieved and can introduce a variety of contaminants. Moreover, outgassing is invariably exacerbated if the sealing process includes a heating process.

Conventional sealing processes are often performed at elevated temperatures. This is often the highest temperature the device can withstand and hence is a higher temperature than the device has encountered elsewhere in the bake-out process. This leads to outgassing occurring from all elements of the package and during the sealing process, hence degrading the vacuum level and introducing contaminants into the atmosphere.

An additional problem of sealing at elevated temperatures is the stress formed in the seal during cooling due to the differential thermal expansion coefficients of the materials involved.

Automation of such sealing processes can also be complex and expensive due to the requirements for vacuum, temperature control, alignment and other processing parameters. Alternative sealing methods in which the inside of an enclosure is evacuated and then the enclosure is sealed by closure of a valve or exhaust tube require additional parts and processing steps for the sealing process and tend to be subject to either poor hermeticity, high cost or outgassing during a heating process in the sealing step.

An alternative sealing method which does not require a high temperature sealing step is described in U.S. Pat. No. 6,252,229. U.S. Pat. No. 6,252,229 describes a sealed cavity microstructure having first and second wafers that are positioned relative to each other so as to from a cavity therebetween. The microstructure includes a pressure seal and a structural bond arranged between the first and second wafers to integrate said wafers.

The technique of U.S. Pat. No. 6,252,229 utilises the accurate dimensions and close tolerances achievable with wafer scale processing methods to provide a reliable seal to the microstructure. Notwithstanding the effectiveness of this technique, the resulting sealed cavity exhibits a small internal volume, making any vacuum contained therein vulnerable to compromise during the lifetime of the device.

It is an object of the present invention to mitigate at least some of the disadvantages of the above packaging methods, and to provide a simplified hermetic packaging method and hermetically sealed enclosure. It is a further object of the present invention to provide an hermetic packaging method in which the temperature of the heating process is minimised or which obviates heating.

According to a first aspect of the present invention, a method of hermetically packaging an electronic device, in an enclosure comprising mutually inter-engageable first and second housing members, comprises the steps of (i) securing the electronic device to the first housing member, (ii) engaging the first and second housing members such that an hermetic seal is provided there between, wherein the engagement step is performed in a controlled atmosphere.

The method provides a simple and cost effective sealing procedure for hermetically packaging the electronic device. Furthermore, the sealing step reduces contamination of the controlled atmosphere and reduces outgassing. Where the controlled atmosphere comprises a vacuum, degradation of the vacuum during sealing is reduced.

In a preferred embodiment, the first housing member comprises a base portion, to which the electronic device is secured during the securing step, and an engagement portion adapted to engage with the second housing member, and wherein the method further comprises the step of attaching the base portion to the engagement portion prior to engaging the first and second housing members.

The step of attaching the base portion of the first housing member to the engagement portion does not need to be performed in an inert atmosphere or a vacuum, as it would be in a conventional vacuum assembly process. Accordingly, a wider range of processes can be used to package the electronic device and hence the assembly cost can be reduced.

In another preferred embodiment, the first and second housing members are adapted to inter-engage to form an interference fit there between, said interference fit providing the hermetic seal.

Alternatively, the enclosure further comprises sealing means interposed between the first and second housing members, said sealing means providing the hermetic seal.

The sealing means may comprise at least one of a metal, a eutectic alloy, an elastomer and an adhesive. For example, the sealing means comprise an indium seal or a compressible elastomeric ring.

Conveniently, the method further comprises the intermediate step of applying the sealing means to least one of the first and second housing members prior to engaging the first and second housing members.

Advantageously, the enclosure further comprises spacer means disposed adjacent the sealing means so as to preclude over-compression of the sealing means during the engagement step. Additionally, or alternatively, the enclosure comprises retaining means disposed adjacent the sealing means so as to retain the sealing means.

In a preferred embodiment, the second housing member comprises a first substantially transmissive optical element and an engagement portion adapted to engage with the first housing member.

Where enclosure comprises sealing means, the hermetic seal may be provided between the first housing member and the first optical element via said sealing means.

In another preferred embodiment, the second housing member is adapted to receive a second substantially transmissive optical element.

Advantageously, the controlled atmosphere comprises an inert gas. The inert gas may comprise at least one of nitrogen and argon.

Preferably, the controlled atmosphere comprises a vacuum.

The step of engaging the first and second housing members may include the step of bonding said housing members. The bonding step may comprise one of friction welding and friction soldering.

Conveniently, the first and second housing members comprise metal cylinders having a substantially circular cross section.

According to a second aspect of the present invention there is now proposed an electronic device comprising an electronic element, a first housing member, and a second housing member, the first and second housing members having an engagement hermetic seal there between so as to define around the electronic element an hermetic enclosure having a controlled atmosphere within.

According to a third aspect of the present invention there is now proposed an electronic device comprising an electronic element, a first housing member, and a second housing member, the first and second housing members defining an hermetic enclosure, wherein the electronic element is located within the hermetic enclosure and wherein the hermetic enclosure is formed by engaging the first and second housing members in a controlled atmosphere such that an engagement hermetic seal is provided there between.

The above electronic devices are advantageous in that they utilise a simple and cost effective hermetic seal. Furthermore, the hermetic seal reduces contamination of the controlled atmosphere and reduces outgassing during the sealing process. Where the controlled atmosphere comprises a vacuum, degradation of the vacuum during sealing is reduced.

In a preferred embodiment of the second or third aspect of the present invention, the engagement hermetic seal comprises an interference seal between the first and second housing members.

In another embodiment of the second or third aspect of the present invention, the engagement hermetic seal comprises a friction weld between the first and second housing members.

Preferably, the electronic device according to the second or third aspect of the present invention further comprises sealing means interposed between the first and second housing members, said sealing means providing the engagement hermetic seal. Conveniently, the first and second housing members may be held in engagement by an interference fit there between.

In a preferred embodiment of the second or third aspect of the present invention, the sealing means comprise at least one of a metal, a eutectic alloy, an elastomer and an adhesive. For example, the sealing means comprise an indium seal or a compressible elastomeric ring.

In another preferred embodiment of the second or third aspect of the present invention, the enclosure further comprises spacer means disposed adjacent the sealing means so as to preclude over-compression of the sealing means. The enclosure may comprise retaining means disposed adjacent the sealing means so as to retain the sealing means.

In a further preferred embodiment of the second or third aspect of the present invention, the second housing member comprises a first substantially transmissive optical element and an engagement portion adapted to engage with the first housing member.

The first optical element may comprise a lens. Advantageously, the first optical element comprises at least one of chalcogenide glass, silicon and germanium.

Where the electronic device according to the second or third aspect of the present invention comprising sealing means, the engagement hermetic seal may be provided between the first housing member and the first optical element via the sealing means.

In another preferred embodiment of the second or third aspects of the present invention, the second housing member includes a second substantially transmissive optical element. The second optical element may comprises chalcogenide glass.

In a further preferred embodiment of the second or third aspects of the present invention, the controlled atmosphere comprises an inert gas. The inert gas may comprise at least one of nitrogen and argon. Preferably, the controlled atmosphere comprises a vacuum.

According to a fourth aspect of the present invention, there is now proposed a thermal detector housed within an hermetic enclosure comprising mutually inter-engaged first and second housing members, the second housing member comprising a first substantially transmissive optical element; wherein said housing members enclose the thermal detector within a controlled atmosphere and provide an hermetic seal around said thermal detector.

In a preferred embodiment, the first and second housing members form an interference fit there between, said interference fit providing the hermetic seal.

In another preferred embodiment, the enclosure further comprises sealing means interposed between the first and second housing members, said sealing means providing the hermetic seal.

Conveniently, the sealing means comprise at least one of a metal, a eutectic alloy, an elastomer and an adhesive. For example, sealing means may comprise an indium seal or a compressible elastomeric ring.

Advantageously, the first optical element comprises a lens. The first optical element may comprises at least one of chalcogenide glass, silicon and germanium.

Where the enclosure comprises sealing means, the hermetic seal may be provided between the first housing member and the first optical element via the sealing means.

In a further preferred embodiment, the second housing member includes a second substantially transmissive optical element. Advantageously, the second optical element comprises chalcogenide glass.

In a preferred embodiment, the controlled atmosphere comprises an inert gas. The inert gas may comprise at least one of nitrogen and argon.

Advantageously, the controlled atmosphere comprises a vacuum.

Figure 3:
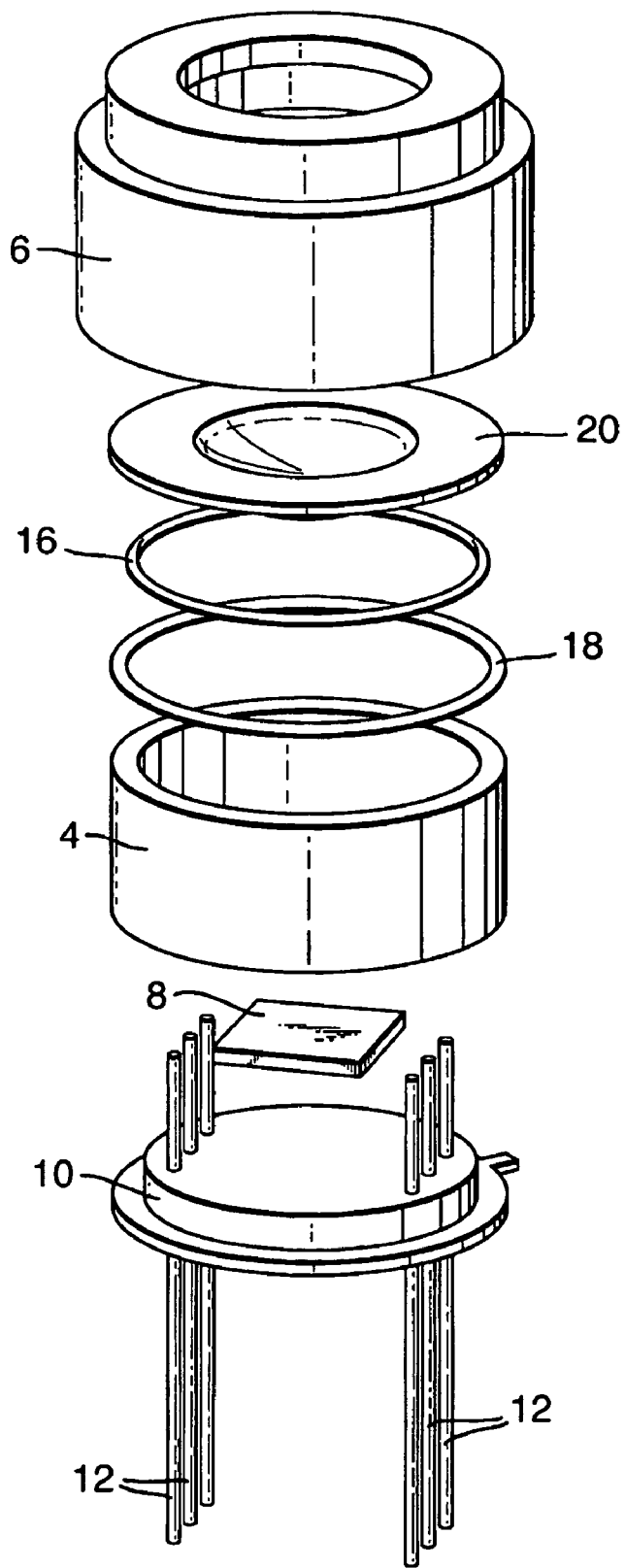

The invention will now be described, by example only, with reference to the accompanying drawings in which;

FIG. 1 shows a schematic cross sectional representation of an hermetic enclosure according to the present invention, FIG. 2 shows a cut-away schematic representation of an hermetic enclosure according to the present invention, FIG. 3 shows an exploded schematic representation of an hermetic enclosure according to the present invention, FIG. 4 shows a schematic cross sectional representation of an alternative hermetic enclosure according to the present invention.

Referring to FIG. 1, an hermetically sealed enclosure (2) according to one embodiment of the present invention comprises a first housing member (4) and a second housing member (6) which together enclose an electronic device (8) disposed within said housing members. The housing members (4, 6) are arranged such that they fit together to form an hermetic seal around the electronic device. In practice the housing members (4, 6) may comprise inter-engageable cylinders. In FIG. 1, the second housing member (6) has a closed end to provide a lid for the hermetic enclosure. FIG. 1 shows the first housing member (4) attached to a separate base (10). However, a separate base is not required if the first housing member (4) is closed cylinder, in which case the base (10) is integral to the first housing member (4). In practice, the cylinders may be fabricated from metal, ceramic, glass, plastic or any other suitable material. In particular, the cylinders may exhibit a substantially circular cross section.

The electronic device (8) is disposed on a base (10) and connected to external connections (12) via feedthroughs (14) on the base (10). The feedthroughs (14) may comprise conventional glass-to-metal feedthroughs.

The first and second housing members (4, 6) may be arranged such that they fit together to form an interference fit, thereby providing an hermetic seal around the electronic device. Alternatively, or in addition, a seal (16) may be disposed between the first housing member (4) and the second housing member (6). The seal (16) provides a continuous, airtight connection between the two housing members (4, 6).

In practice, the seal (16) may be a ring of soft metal such as indium located on the top surface of the first housing member (4). The seal (16) may be accompanied by one or more additional ring (18) which acts as a spacer layer to prevent over-compression of the seal. Additionally, or alternatively, the ring (18) may act as a dam to prevent the escape of the sealing material (16).

The additional ring (18) which acts as the spacer and/or dam features can also be designed into the shape of the housing member (4, 6), thus reducing the number of components and assembly steps. Location features may also be included to ease assembly.

Other sealing materials can be used, for example other soft metals, solders and eutectic alloys, as well as rubber seals and glues. For example, an adhesive could be applied outside of the seal (16) to add mechanical strength to the seal (16). In principle, the seal material could be added in vacuum, for example by vacuum evaporation. The sealing ring (16) could also be deposited onto the assembly by an overmoulding process in the case of an elastomeric seal.

The hermetic enclosure is fabricated as follows. The electronic device (8) is attached to the base (10) (for example, a transistor can header such as a TO-5 or a TO-8 header) by industry standard processes. Any conventional low-outgassing die attach methods may be used. If required, the electrical connections are then bonded to the feedthroughs (14) (for example, glass-to-metal feedthroughs) on the base (10), also in a standard manner. The first housing member (4), comprising a metal cylinder in this instance, is attached to the base (10). The metal cylinder may be formed by drawing, punching or machining processes. Additional features, such as alignment features or a lip to provide a reduced aperture may be used on this part in order to assemble the part with a second housing member (6) of the required geometry.

The metal cylinder (4) may be attached by welding, soldering, gluing, crimping or other attachment processes, which can be selected for their cost and hermeticity properties. In the case of welding, resistance welding, electron-beam welding, laser welding, or other welding processes can be used as appropriate for the size and geometry of the package.

The fact that this process is not performed in an inert atmosphere or a vacuum, as it would be in a conventional metal can vacuum assembly process, means that a wider range of processes can be used and the assembly cost can be reduced. Whilst the above step does not require an inert atmosphere or a vacuum, it may be desirable to fabricate the hermetic enclosure and attach the electronic device under clean-room conditions to avoid particulate contamination of the device. This sub-assembly, along with the other package components, can then be stored in under controlled conditions, at an elevated temperature until required. This reduces the need for time-consuming bake-out processes at the time of assembly.

The next assembly step is performed under a controlled atmosphere. The controlled atmosphere may comprise an inert gas, for example nitrogen or argon. Additionally, or alternatively, the controlled atmosphere may comprise a vacuum. Herein, the term vacuum shall refer to a decrease of pressure below normal ambient atmospheric pressure. Note that the controlled atmosphere under which this next assembly step is performed is not merely a clean-room environment as used above for fabricating the hermetic enclosure.

The second housing member (6) is pressed down onto the seal (16), in this case an indium sealing ring. Location features allow this assembly process to be performed with high accuracy and at low cost.

The second housing member (6) may be designed to slide over the first housing member (4), or vice versa, and to form an interference fit therewith. In this case, no additional means are required to hold the enclosure together.

The interference fit itself may be used to provide a seal in this case. Alternatively, where the housing members (4, 6) comprise metal cylinders, the second housing member (6) may be heated prior to assembly and allowed to cool and contract over the first housing member (4), thus improving the seal. Alternatively, where the housing members (4, 6) comprise metal cylinders, the friction due to the second housing member (6) being moved over the first housing member (4) can be used to produce heating and produce a friction welded seal or to melt a pre-placed mass of solder, referred to herein as frictional soldering.

In a preferred implementation the seal (16) consists of indium solder, although, as mentioned above, other sealing methods can be used.

The above method of forming the hermetic enclosure is advantageous in that only an alignment and compression operation must be performed under a controlled atmosphere, thus simplifying the manufacture. The low part count and simple assembly procedure enables a very low cost hermetic enclosure to be manufactured. Furthermore, the fabrication process uses a low temperature sealing step, which has several advantages. Firstly, there is no outgassing during the sealing step. Secondly, materials of differing thermal expansion coefficients can be joined. Thirdly, materials subject to damage by heating or thermal shock can be joined.

Where the enclosure is evacuated to a low pressure, getters may be included in the package to remove gases which accumulate due to leakage or outgassing over a period of several years, thereby maintaining a high level of vacuum over a long period of time.

In addition, or alternatively, the internal volume of the hermetically sealed enclosure (2) is arranged to be as large as possible for a given application so as to mitigate the effects of leakage and outgassing on the vacuum level within the enclosure. A useable vacuum level can be sustained over a long period of time by maximising the internal volume of the hermetically sealed enclosure (2) as suggested above. For example, the enclosure may be arranged to exhibit an initial internal pressure of 1 Pascal, degrading to a pressure of 10-100 Pascal over the design life of the device (referred to below as the end-of-life pressure).

Equally, the initial and end-of-life pressures within enclosure may be specified as design parameters at the outset, in which case the internal volume of the enclosure can be calculated and optimised such that the pressure within the enclosure at the end of the design life does not exceed the design specification. The calculation requires an appreciation of the outgassing and leakage mechanisms at work within the enclosure, both of which would be familiar to the skilled person. Typically, the end-of-life pressure shall not exceed 100 Pascal, 80 Pascal, 60 Pascal, 40 Pascal, 20 Pascal, or 10 Pascal depending on the particular application.

Typically, the hermetically sealed package will have an internal volume greater than 0.5 $cm^3$ (cubic centimetres), 0.75 $cm^3$ or 1 $cm^3$. The maximum internal volume of the hermetically sealed package will be less than 2 $cm^3$, 1.75 $cm^3$, 1.5 $cm^3$ or 1.25 $cm^3$. The design life of the device is anticipated to be in excess of 10 years.

Referring now to FIG. 2, the second housing member (6) may perform additional functions, such as providing an aperture for electromagnetic radiation to enter or leave. Alternatively, the second housing member (6) may hold one or more additional optical components in place.

In this embodiment of the present invention, the second housing member (6) comprises an optical element (20) providing a window or lens to transmit electromagnetic radiation in a preferred frequency range. For example, the optical element (20) may take the form of an infra-red window or lens made from a chalcogenide glass material such as the one of the AMTIR materials manufactured by Amorphous Materials or one of the GASIR materials manufactured by Umicore. These lenses have the advantage of low manufacturing cost. Alternatively, the optical element (20) may take the form of an infra-red window or lens made from silicon or germanium.

The use of a lens integral to the second housing member (6) enables electromagnetic radiation to be focussed onto the electronic device (8) housed within the hermetically sealed enclosure (2), and obviates external optical components.

The electronic device (8) may comprise an optical detector, for example an optical detector sensitive to electromagnetic radiation having wavelengths in the visible spectrum, or a microbolometer detector sensitive to electromagnetic radiation having wavelengths in the infrared spectrum (for example thermal radiation). In particular, the electronic device may comprise a multi-element detector, in which case the integral lens enables a complete imaging system to be achieved within the hermetically sealed enclosure (2).

The lens may comprise a simple lens having a single element, a compound lens having a plurality of elements, a fresnel lens, or an array of lenses, for example an array of microlenses.

The optical element (20) may be metallised at the edges to enable a wider range of vacuum sealing processes, for example soldering processes. In the case of metallised optical element (20), a soldering process may be used to attach the optical element (20) to the second housing member (6) prior to assembling the first and second housing members (4, 6) as described above. Alternatively, or in addition, a low temperature soldering process may be incorporated into the sealing steps performed in a controlled atmosphere. The soldering process creates negligible outgassing and so may be used without compromising the purity of the controlled atmosphere within the hermetic enclosure (2) or the level of the vacuum therein.

This versatility with regard to the choice of sealing processes makes the invention useful in a wide range of applications, since the sealing process can be selected in order to obtain the required hermeticity for a given application.

FIG. 3 shows an exploded schematic representation of an hermetic enclosure according to the present invention. Elements in common with FIGS. 1 and 2 are given like reference numerals.

FIG. 4 shows an alternative embodiment of the present invention in which the optical element (20) is used in combination with an additional optical element (22). In this case, the first optical element (20) comprises an infrared lens or window made from silicon or germanium. A silicon or germanium window has improved mechanical and thermomechanical properties compared to the chalcogenide glass lens.

The additional optical element (22) may comprise a chalcogenide glass lens glued in an accurately-defined location above the first optical element (20), the location being defined by location feature(s) in the second housing member (6). Hence, the relatively fragile lens (22) is not directly exposed to the vacuum or to other mechanical and thermal stresses which may be involved in the vacuum sealing process. As above, although an indium seal is illustrated in this case, the first optical element (20) may be metallised at the edges to enable a wider range of vacuum sealing processes, for example soldering processes.

Whilst in the foregoing embodiments the components are largely made of metal, the components may alternatively or additionally be made of ceramic (for example, using a ceramic chip carrier in place of the metal transistor can header), glass, plastic or other suitable materials.

In particular, the hermetically sealed enclosure of the present invention may be used to house thermal detectors, for example microbolometer arrays.

The invention claimed is:

1. A method of hermetically packaging an electronic device, in an enclosure comprising mutually inter-engageable first and second housing members, comprising the steps of
    (i) securing the electronic device to the first housing member,
    (ii) engaging the first and second housing members such that an hermetic seal is provided there between,
    wherein the engagement step is performed in a controlled atmosphere.

2. A method according to claim 1 wherein the first housing member comprises a base portion, to which the electronic device is secured during the securing step, and an engagement portion adapted to engage with the second housing member, and wherein the method further comprises the step of attaching the base portion to the engagement portion prior to engaging the first and second housing members.

3. A method according to claim 1 wherein the first and second housing members are adapted to inter-engage to form an interference fit there between, said interference fit providing the hermetic seal.

4. A method according to claim 1 wherein the enclosure further comprises a seal interposed between the first and second housing members, said seal providing the hermetic seal.

5. A method according to claim 4 wherein the seal comprises at least one of a metal, a eutectic alloy, an elastomer and an adhesive.

6. A method according to claim 5 wherein the seal comprises an indium seal.

7. A method according to claim 5 wherein the seal comprises a compressible elastomeric ring.

8. A method according to claim 4 and further comprising the intermediate step of applying the seal to at least one of the first and second housing members prior to engaging the first and second housing members.

9. A method according to claim 4 wherein the enclosure further comprises a spacer disposed adjacent the seal so as to preclude over-compression of the seal during the engagement step.

10. A method according to claim 4 wherein the enclosure comprises a retainer disposed adjacent the seal so as to retain the seal.

11. A method according to claim 1 wherein the second housing member comprises a first substantially transmissive optical element and an engagement portion adapted to engage with the first housing member.

12. A method according to claim 11 wherein the hermetic seal is provided between the first housing member and the first optical element via a seal.

13. A method according to claim 11 wherein the second housing member is adapted to receive a second substantially transmissive optical element.

14. A method according to claim 1 wherein the controlled atmosphere comprises an inert gas.

15. A method according to claim 14 wherein the inert gas comprises at least one of nitrogen and argon.

16. A method according to claim 1 wherein the controlled atmosphere comprises a vacuum.

17. A method according to claim 1 wherein the step of engaging the first and second housing members includes the step of bonding said housing members.

18. A method according to claim 17 wherein the bonding step comprises one of friction welding and friction soldering.

19. A method according to claim 1 wherein the first and second housing members comprise metal cylinders having a substantially circular cross section.

20. An electronic device comprising an electronic element, a first housing member, and a second housing member, the first and second housing members having an engagement hermetic seal there between so as to define around the electronic element an hermetic enclosure having a controlled atmosphere within, wherein the engagement hermetic seal comprises an interference seal between the first and second housing members.

21. An electronic device according to claim 20 wherein the engagement hermetic seal comprises a friction weld between the first and second housing members.

22. An electronic device according to claim 20 and further comprising a seal interposed between the first and second housing members, said seal providing the engagement hermetic seal.

23. An electronic device according to claim 22 wherein the first and second housing members are held in engagement by an interference fit there between.

24. An electronic device according to claim 22 wherein the seal comprises at least one of a metal, a eutectic alloy, an elastomer and an adhesive.

25. An electronic device according to claim 24 wherein the seal comprises an indium seal.

26. An electronic device according to claim 24 wherein the seal comprises a compressible elastomeric ring.

27. An electronic device according to claim 22 wherein the enclosure further comprises a spacer disposed adjacent the seal so as to preclude over-compression of the seal.

28. An electronic device according to claim 22 wherein the enclosure comprises a retainer disposed adjacent the seal so as to retain the seal.

29. An electronic device according to claim 20 wherein the second housing member comprises a first substantially transmissive optical element and an engagement portion adapted to engage with the first housing member.

30. An electronic device according to claim 29 wherein the first optical element comprises a lens.

31. An electronic device according to claim 29 wherein the first optical element comprises at least one of chalcogenide glass, silicon and germanium.

32. An electronic device according to claim 29 wherein the engagement hermetic seal is provided between the first housing member and the first optical element via a seal.

33. An electronic device according to claim 29 wherein the second housing member includes a second substantially transmissive optical element.

34. An electronic device according to claim 33 wherein the second optical element comprises chalcogenide glass.

35. An electronic device according to claim 20 wherein the controlled atmosphere comprises an inert gas.

36. An electronic device according to claim 35 wherein the inert gas comprises at least one of nitrogen and argon.

37. An electronic device according to claim 20 wherein the controlled atmosphere comprises a vacuum.

38. An electronic device comprising an electronic element, a first housing member, and a second housing member, the first and second housing members defining an hermetic enclosure,
   wherein the electronic element is located within the hermetic enclosure and wherein the hermetic enclosure is formed by engaging the first and second housing members in a controlled atmosphere such that an engagement hermetic seal is provided there between.

39. An electronic device having a thermal detector housed within an hermetic enclosure comprising mutually inter-engaged first and second housing members, the second housing member comprising a first substantially transmissive optical element; wherein said housing members enclose the thermal detector within a controlled atmosphere and provide an engagement hermetic seal around said thermal detector.

* * * * *